United States Patent
Cui et al.

(10) Patent No.: US 9,892,941 B2
(45) Date of Patent: Feb. 13, 2018

(54) MULTI-ZONE RESISTIVE HEATER

(75) Inventors: Anqing Cui, Sunnyvale, CA (US);
Binh Tran, San Jose, CA (US);
Alexander Tam, Union City, CA (US);
Jacob W. Smith, Santa Clara, CA (US);
R. Suryanarayanan Iyer, Santa Clara, CA (US); Joseph Yudovsky, Campbell, CA (US); Sean M. Seutter, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 2146 days.

(21) Appl. No.: 12/485,160

(22) Filed: Jun. 16, 2009

(65) Prior Publication Data

US 2009/0314762 A1 Dec. 24, 2009

Related U.S. Application Data (63) Continuation-in-part of application No. 11/293,626, filed on Dec. 1, 2005, now abandoned.

(51) Int. Cl.
*H05B 3/68* (2006.01)
*H01L 21/67* (2006.01)

(52) U.S. Cl.
CPC .. *H01L 21/67103* (2013.01); *H01L 21/67248* (2013.01); *H05B 3/68* (2013.01)

(58) Field of Classification Search
CPC ........ H01L 21/67103; H01L 21/67248; H05B 3/68
USPC .......... 219/443.1–468.2, 482–490, 542–548; 118/724, 725
See application file for complete search history.

(56) References Cited

U.S. PATENT DOCUMENTS

| | | | |
|---|---|---|---|
| 5,059,770 A * | 10/1991 | Mahawili | 219/391 |
| 6,242,719 B1 * | 6/2001 | Kano et al. | 219/444.1 |
| 6,423,949 B1 | 7/2002 | Chen et al. | |
| 6,617,553 B2 | 9/2003 | Ho et al. | |
| 6,646,235 B2 | 11/2003 | Chen et al. | |
| 6,875,960 B2 | 4/2005 | Yamaguchi et al. | |
| 6,891,134 B2 * | 5/2005 | Mandal | 219/465.1 |
| 7,173,219 B2 | 2/2007 | Okajima et al. | |
| 7,189,946 B2 | 3/2007 | Goto et al. | |
| 7,247,819 B2 | 7/2007 | Goto et al. | |

(Continued)

FOREIGN PATENT DOCUMENTS

| | | |
|---|---|---|
| JP | 2003-017377 | 1/2003 |
| JP | 2005-303014 | 10/2005 |
| KR | 20050054952 | 6/2005 |

OTHER PUBLICATIONS

Korean Office Action in Appln. No. 10-2006-0118960, (May 12, 2009), 6 pgs.

*Primary Examiner* — Sang Y Paik
(74) *Attorney, Agent, or Firm* — Servilla Whitney LLC (57) ABSTRACT

Apparatus, reactors, and methods for heating substrates are disclosed. The apparatus comprises a stage comprising a body and a surface having an area to support a substrate, a shaft coupled to the stage, a first heating element disposed within a central region of the body of the stage, and at least second and third heating elements disposed within the body of the stage, the at least second and third heating elements each partially surrounding the first heating element and wherein the at least second and third heating elements are circumferentially adjacent to each other.

20 Claims, 6 Drawing Sheets

(56) References Cited

U.S. PATENT DOCUMENTS 7,364,624 B2    4/2008  Mariner et al.
7,491,432 B2 *  2/2009  Kachi et al. ................. 428/34.4
7,718,930 B2 *  5/2010  Kawasaki et al. ......... 219/444.1

* cited by examiner

MULTI-ZONE RESISTIVE HEATER

CROSS REFERENCE TO RELATED APPLICATIONS

This application is a continuation-in-part of U.S. patent application Ser. No. 11/293,626, filed on Dec. 1, 2005, the entire contents of which is incorporated herein by reference.

BACKGROUND OF THE INVENTION

Embodiments of the present invention pertain to resistive heaters, apparatus incorporating resistive heaters and methods of heating substrates such as semiconductor wafers.

Resistive heaters are widely employed in the heating systems of chemical vapor deposition (CVD) systems. Temperature uniformity is an important consideration in CVD processes, and as a result, multi-zone resistive heaters have been developed to provide greater control over the heating characteristics of the heating apparatus in CVD systems. For example, U.S. Pat. No. 6,646,235 to Chen et al., the entire content of which is incorporated herein by reference, discloses a CVD resistive heater that has an inner zone and an outer zone, where the outer zone completely surrounds the inner zone. By providing these concentric zones, it is possible to compensate for the different rates of heat loss exhibited by the inner and outer regions of the heating apparatus, and so provide more uniform heating across the entire diameter of a wafer.

Even slight variations in temperature uniformity across a wafer, on the order of just a few degrees Celsius, can adversely affect a CVD process. Limitations in manufacturing tolerances make it extremely difficult to make a multi-zone heater that has consistent heating power characteristics around its entire circumference. Hence, at a given radius, one region of the resistive heater may provide more or less heating power than another region at that same radius. The resulting temperature variations introduce one layer of complexity that must be controlled to insure process repeatability across multiple wafers for the same resistive heater. Moreover, putatively identical resistive heaters display different heating power characteristics amongst themselves, which introduces yet another layer of complexity that is adverse to process repeatability. In addition, the CVD chamber itself may have regions that exhibit irregularities in temperature uniformity, introducing further possible temperature irregularities.

Accordingly, it would be desirable to provide a resistive heater that can provide compensation for heating irregularities to enhance process repeatability in high temperature deposition systems, such as reactors incorporating CVD chambers.

SUMMARY OF THE INVENTION

Aspects of the present invention provide methods, apparatus and systems related to resistive heaters. One aspect pertains to an apparatus that includes a stage, and a shaft coupled to the stage. The stage includes a body with a surface for supporting a wafer. Heating elements comprised of planar, continuous sections of material are provided. At least a first heating element is disposed within a recess within a central region of the body. Additional heating elements may be provided in the central region. At least two other heating elements are disposed within recesses within the body, each partially surrounding the central region, and each circumferentially adjacent to the other. In one embodiment, only one temperature sensor, for example, a thermocouple, disposed in the central region, is used to control the heating power of all of the heating elements. In another embodiment, four heating elements are provided within recesses within the body that each partially surround the central region. In yet another embodiment, the heating element in the central region is disposed adjacent to a top side of the body, and the other heating elements are disposed adjacent to a bottom side of the body.

Another aspect of the invention provides a heating system that includes a resistive heater, a temperature sensor for the resistive heater, a power supply for the resistive heater, and a control system to control the power supply. The resistive heater has a stage and a shaft coupled to the stage. The stage has a body with a surface for supporting a wafer. Heating elements comprised of planar, continuous sections of material are provided. In one or more embodiments, a first resistive heating element is disposed within recess within a central region of the body. At least second and third resistive heating elements are disposed within recesses within the body, each partially surrounding the central region, and each circumferentially adjacent to the other. The first, second and third heating elements provide heat to respective first, second and third zones of the stage. The power supply includes first, second and third power sources for respectively providing power to the first, second and third resistive heating elements. In one embodiment, the control system controls the first, second and third power sources according to an output from the temperature sensor and a power ratio of the power to the second and third resistive heating elements. In one embodiment, only the temperature sensor is used to measure the temperature of the resistive heater. In another embodiment, the temperature sensor is a thermocouple disposed within the central region of the body of the stage. In another embodiment, additional temperature sensors such as thermocouples may be provided for temperature control of the individual zones.

Another aspect pertains to a method for providing process repeatability in resistive heating systems. A heating surface is divided into a central region and at least two outer regions, with each outer region only partially surrounding the central region. Each outer region is given a respective power ratio with respect to the central region. The temperature of the central region is measured during a heating process, and heating power is delivered to the central region according to the measured temperature. Heating power is delivered to each outer region according to the heating power delivered to the central region and the respective power ratio of each outer region. In one embodiment, a calibration procedure is performed to obtain the power ratios.

DETAILED DESCRIPTION OF THE INVENTION

Before describing several exemplary embodiments of the invention, it is to be understood that the invention is not limited to the details of construction or process steps set forth in the following description. The invention is capable of other embodiments and of being practiced or being carried out in various ways.

Figure 1:
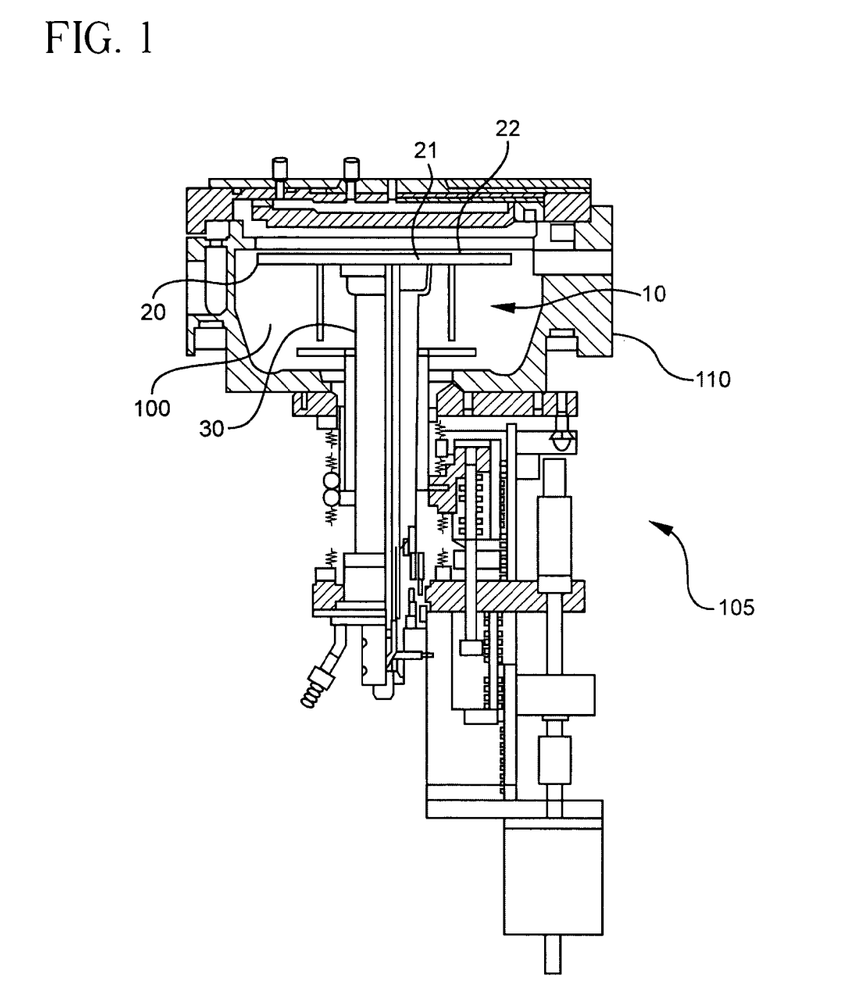
FIG. 1 shows a cross-sectional view of a CVD system with a heating apparatus according to one embodiment.

FIG. 1 presents a cross-sectional view of a CVD system 105. A heating apparatus 10 is disposed within a reaction chamber 100 of the CVD system 105. The reaction chamber 100 may support, for example, a CVD reaction process, an LPCVD reaction process or the like, and is defined and surrounded by chamber body 110. The heating apparatus 10 includes a stage 20 for heating and supporting a wafer, and a shaft 30, shown partly in cross-section, for supporting the stage 20.

Figure 2:
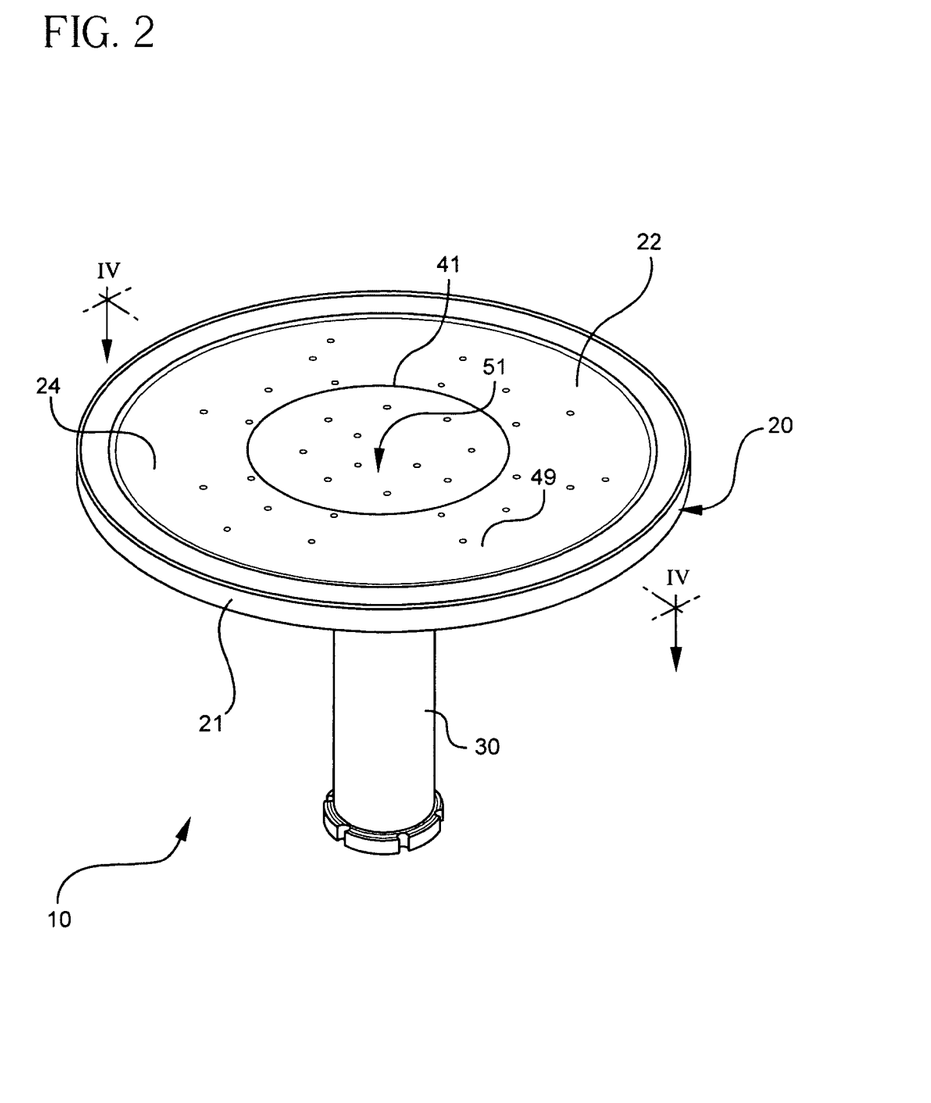
FIG. 2 is a top perspective view of the heating apparatus depicted in FIG. 1.

As shown in FIG. 2, the stage 20 has a body 21 with a top surface 22, which forms a susceptor 24 for supporting a wafer. Body 21 has a central region 41, and outer region 49 that surrounds the central region 41. Disposed just under the top surface 22 of central region 41 is a first resistive heater 51 that heats the central region or zone 41. As shown more clearly in FIG. 4, resistive heater 51 is planar, continuous section of material disposed within a recess of body 21. The use of planar, continuous heating elements disposed within recesses provides distinct advantages over traditional heating elements, such as wound bodies of metal wire, in terms of heating uniformity and element damage. It will be appreciated that the central region or zone 41 can be heated by a single heater 51 or multiple heaters.

Figure 3:
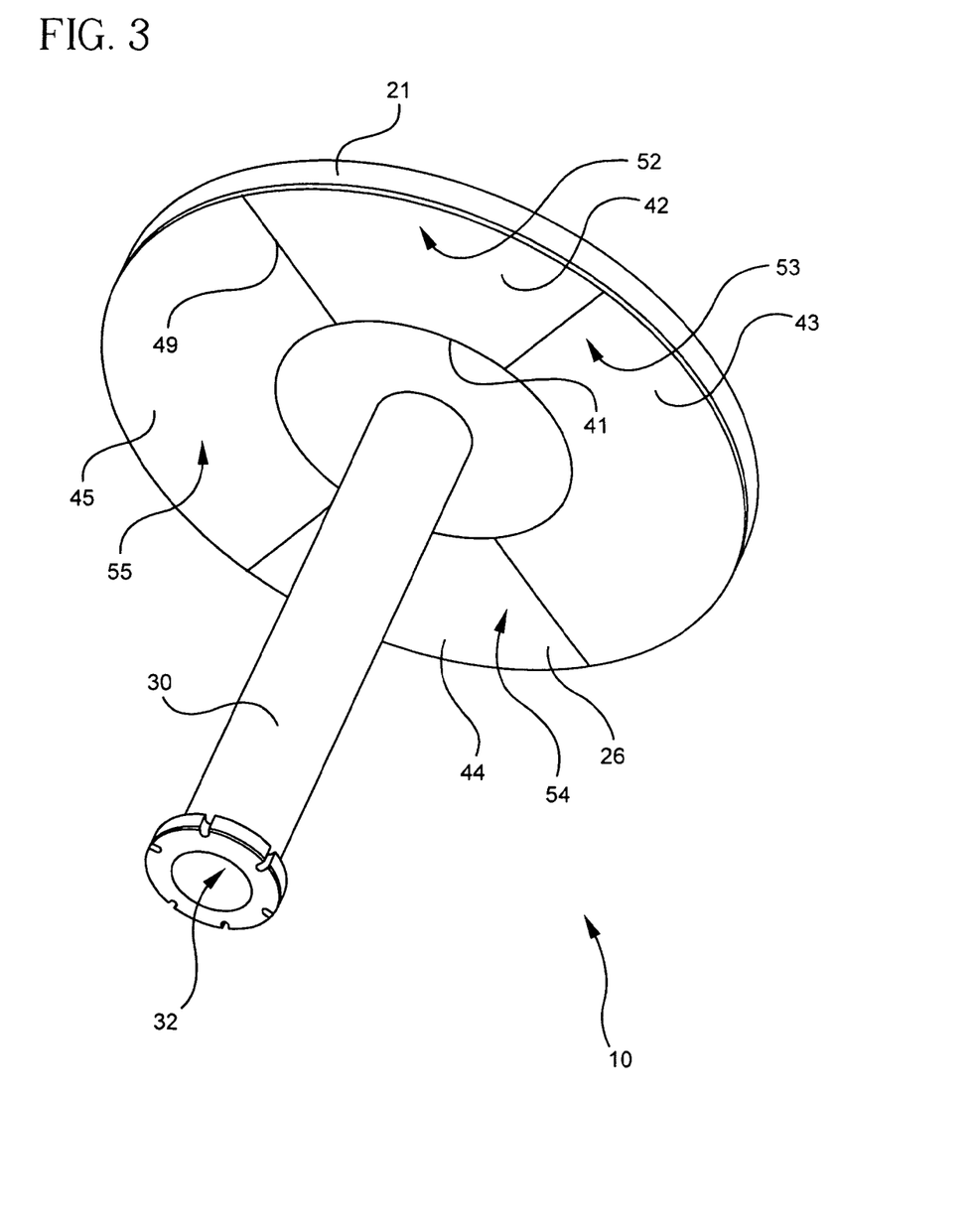
FIG. 3 is a bottom perspective view of the heating apparatus depicted in FIG. 1.
Figure 6:
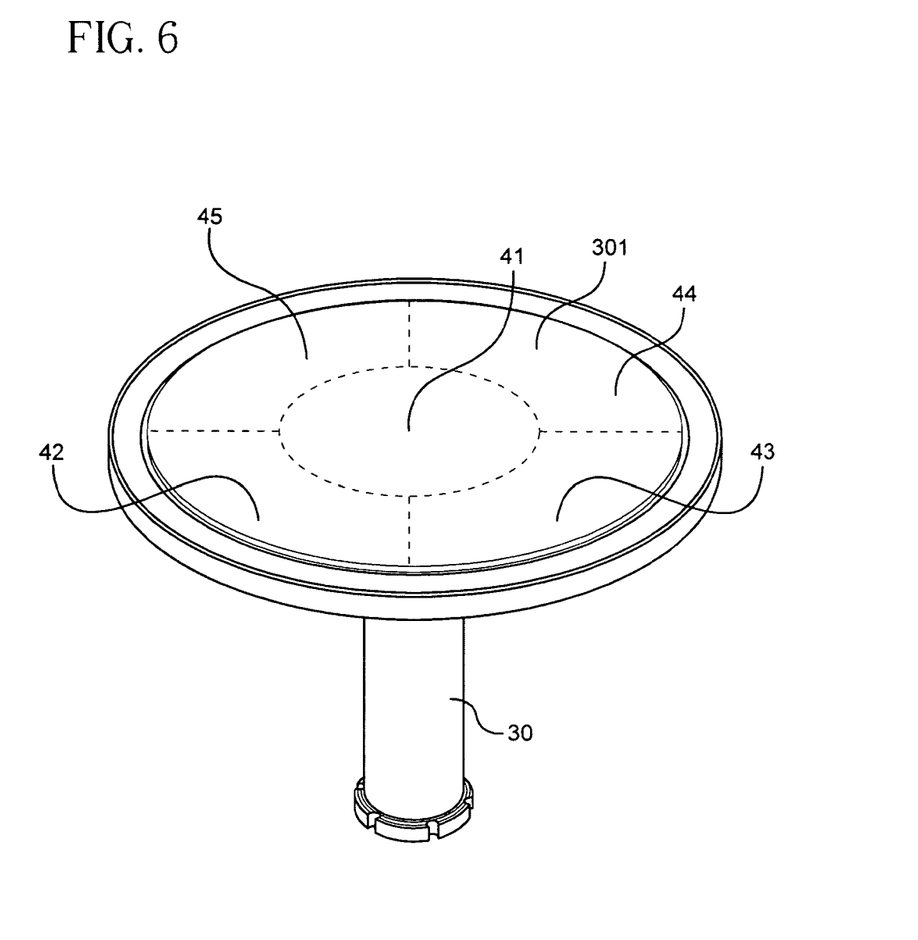
FIG. 6 is a top perspective view of the heating apparatus depicted in FIG. 1 depicting a substrate disposed thereon and the heating regions of the apparatus shown in phantom.

As shown in FIGS. 3 and 6, the body 21 has a bottom surface 26, to which is connected the shaft 30. The shaft 30 is centrally mounted within the central region 41, and has an opening 32 that extends along the longitudinal length of the shaft 30. The outer region 49 of bottom surface 26 is divided into four substantially equal-sized zones 42, 43, 44, 45. A second resistive heater 52 heats zone 42; a third resistive heater 53 heats zone 43; a fourth resistive heater 54 heats zone 44, and a fifth resistive heater 55 heats zone 45. Consequently, the second, third fourth and fifth resistive heaters 52-55 each partially surrounds the first resistive heater 51, and the second, third, fourth and fifth resistive heaters 52-55 are circumferentially adjacent to each other. As with first resistive heater 51, second, third, fourth and fifth resistive heaters 52-55 are planar, continuous sections of material disposed within recesses of body 21 (see FIG. 4).

In the embodiment shown in FIGS. 3 and 6, the second, third, fourth and fifth resistive heaters 52-55 are each disposed just under the bottom surface 26. However, in an alternative embodiment, the second, third, fourth and fifth resistive heaters 52-55 may each be disposed just under the top surface 22. Similarly, in an alternative embodiment the first resistive heater 51 may be disposed just under the bottom surface 26 within the central region 41. For example, in one embodiment, the first resistive heater 51 may be disposed just under the bottom surface 26 in the central region 41, and the second through fifth resistive heaters 52-55 may be disposed just under the top surface 22 in their respective zones 42-45 in the outer region 49. FIG. 6 shows the apparatus with the zones 41-45 shown in phantom and a substrate or wafer 301 disposed on the apparatus. In such an embodiment, the planar, continuous nature of the resistive heaters means that first resistive heater 51 is disposed within a first plane of body 21, while second through fifth resistive heaters 52-55 are disposed within a nonoverlapping second plane of body 21 (see FIG. 4). This allows the temperatures of top surface 22 and bottom surface 26 of body 21 to be independently controlled.

Figure 4:
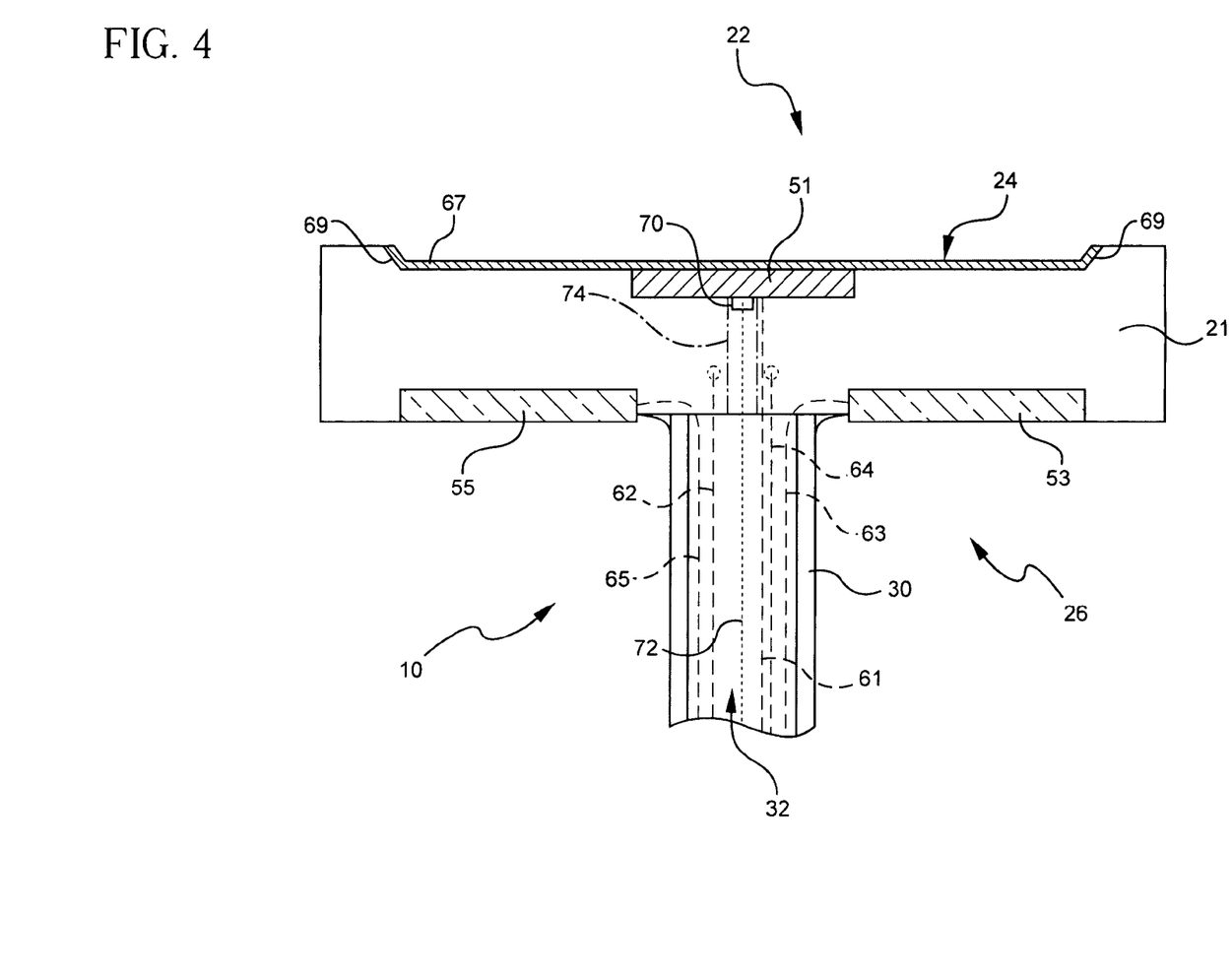
FIG. 4 is a partial cross-sectional view of the heating apparatus depicted in FIG. 1.

FIG. 4 illustrates a cross-sectional view along line IV-IV in FIG. 2. The body 21 and shaft 30 may be made from any suitable material that can withstand the high temperatures and corrosive materials associated with CVD processes, such as aluminum nitride, graphite, aluminum nitride or pyrolytic boron nitride. In one or more embodiments, a dielectric material 67, for example, pyrolytic boron nitride, is disposed across the top surface 22 to form the susceptor 24, upon which a wafer to be processed is placed. The susceptor 24 includes lip edges 69 to ensure the wafer is held snugly and in a well-defined position on the susceptor 24 during processing. First resistive heating element 51 is disposed in the body 21, just under the dielectric layer 69. Third and fifth resistive heating elements 53, 55 are disposed in the body 21 just above the bottom surface 26. Of course, second and fourth resistive heating elements 52, 54 (not shown) would be visible in a similar cross-section that is ninety degrees to line IV-IV. As readily seen in the embodiment shown in FIG. 4, heating elements 51, 53 and 55 (as well heating elements 52 and 54 not shown) are disposed within recesses of body 21. This provides more uniform heating of the body and greater protection for the heating elements than if the elements were merely embedded throughout the body.

All of the resistive heating elements 51-55 may be made from any suitable material known in the art, and ideally should have thermal expansion properties that are similar to those of the body 21. An example of a suitable material for the resistive heating elements 51-55 includes pyrolytic graphite. The resistive heating elements can be disposed within recesses of the stage body by, e.g., CVD deposition. Each resistive heating element 51-55 has a corresponding power line 61-65, running through opening 32 of shaft 30 that provides respective electrical power to the resistive heating element 51-55, and thereby allows independent control of the heating power delivered to the inner region 41, and to each of the outer region zones 42-45. Of course, one or more ground lines (not shown) may be provided, also running through opening 32, to complete the circuit of each resistive heating element 51-55.

A thermocouple 70 may be provided to measure the temperature of the central region 41. In one embodiment, an opening 74, extending up from the bottom surface 26, is used to position thermocouple 70 between the first resistive heating element 51 and resistive heating elements 52, 53, 54 and 55, thereby thermally coupling the thermocouple 70 with the central region 41 of the body 21. A signal line 72 may extend from the thermocouple 70 through the opening 74 of the stage 20, and through the opening 32 of the shaft 30, to provide temperature information about the central region 41 to a control system of the heating apparatus 10. Of course, other temperature sensor configurations are possible. For example, an optical pyrometer may be used to measure the temperature of the central region 41.

Figure 5:
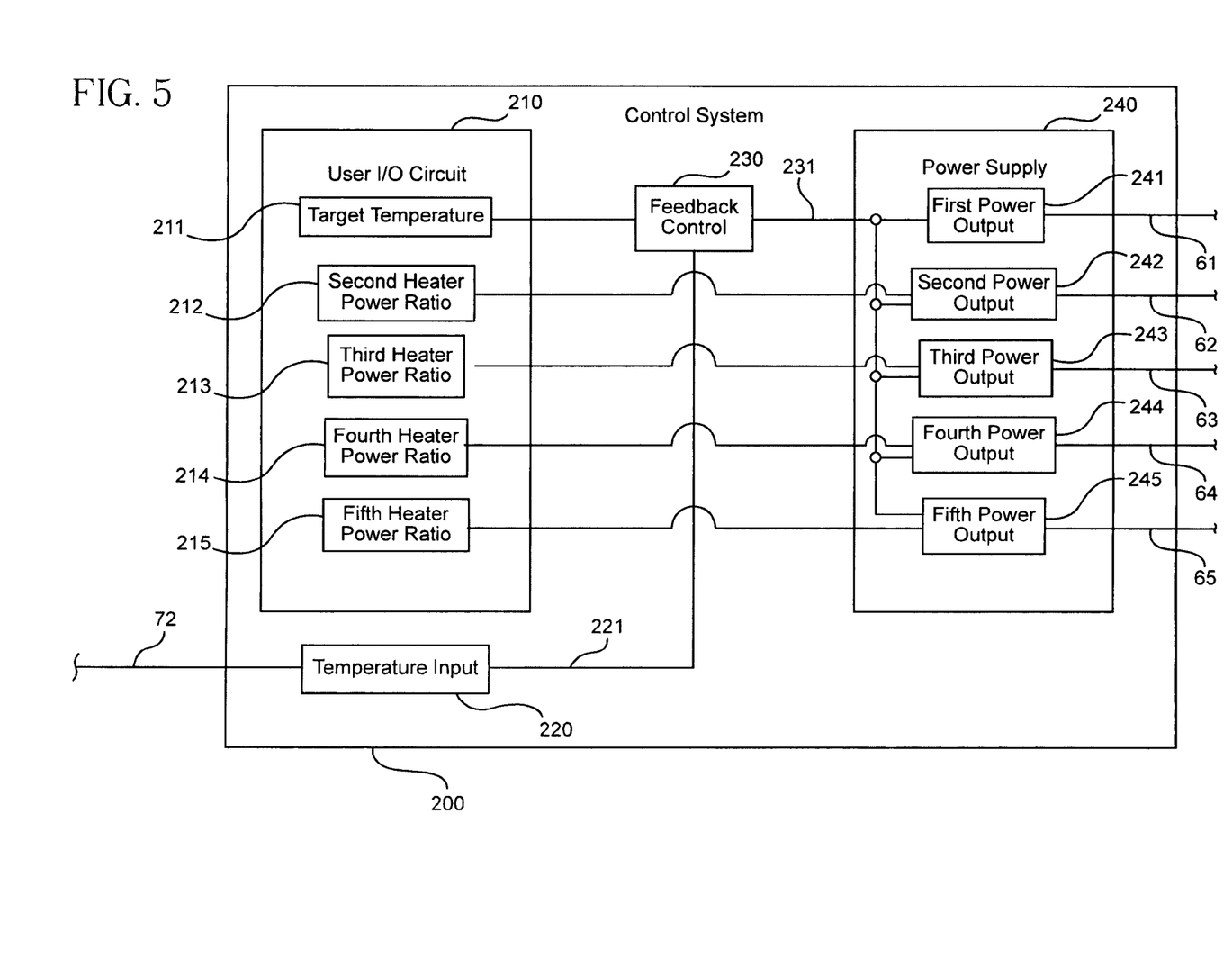
FIG. 5 illustrates a control system for the heating apparatus depicted in FIG. 1.

A control system 200, depicted in FIG. 5, may be used to control the heating apparatus 10. The control system 200 may be part of the control system for the CVD system 105 depicted in FIG. 1, and is electrically connected to the heating apparatus 10. Together, the heating apparatus 10 and the control system 200 form the heating system for the CVD system 105. Numerous possibilities are available for the physical implementation of the control system 200, and an exhaustive review of the various permutations of digital and analog circuits that may be employed to create the control system 200 is beyond the scope of this disclosure. Any suitable implementation of the control system 200 may be used, and providing a detailed control system 200 should be a routine task for one of ordinary skill in the art, after reading the following disclosure.

According to one embodiment, the control system 200 includes a user input/output (I/O) system 210, a temperature input 220, a feedback control circuit 230 and a power supply 240. The user I/O system 210 provides a user interface that allows a user to select a target temperature 211 for the central region 41 of the susceptor 22, and to select second, third, fourth and fifth power ratios 212, 213, 214, 215 for the second third, fourth and fifth resistive heaters 52, 53, 54, 55, respectively.

The temperature input 220 is electrically connected to the signal line 72 of the thermocouple 70 to obtain, in real-time, the current temperature 221 of the central region 41 of the stage 20. The temperature input 220 then passes this current temperature 221 to the feedback control circuit 230. In a manner familiar to those in the art, the feedback control circuit 230 accepts as input the current temperature 221 and the target temperature 211 and generates a heating power control output 231. The purpose of the heating power control output 231 is to control the power delivered to the first resistive heater 51 so that the temperature of the central region 41 as measured by the thermocouple 70 tracks as closely as possible the target temperature 211. The feedback control circuit 230 may be designed to employ any suitable feedback control method known in the art.

The power supply 240 provides the electrical power needed to individually power the resistive heating elements 51, 52, 53, 54, 55 in the heating apparatus 10. The power supply 240 includes a first power output 241 that is electrically connected to the first power line 61 to provide electrical power for the first heating element 51, and thus to heat the central region 41. Similarly, the power supply 240 includes second, third, fourth and fifth power outputs 242, 243, 244 and 245, each of which is respectively electrically connected to the second, third, fourth and fifth power lines 62, 63, 64 and 65 to heat the second, third, fourth and fifth zones 42, 43, 44 and 45.

The first power output 241 accepts as input the heating power control output 231 from the feedback control circuit 230, which may be an analog or digital signal, and in response provides corresponding electrical power on the first power line 61. Hence, the power provided to the first resistive heater 51 by the first power output 241 is directly related to the heating power control output 231 generated by the feedback control circuit 230.

The second power output 242 accepts as input the heating power control output 231 from the feedback control circuit 230, and also the second heater power ratio 212 from the user I/O circuit 210. In response, the second power output 242 provides electrical power on the second power line 62 such that the ratio of electrical power on the first power line 61 to that on the second power line 62 equals the second heater power ratio 212. Hence, the power provided to the second resistive heater 52 by the second power output 242 equals the electrical power provided on the first power line 61 multiplied by (or divided by) the second heater power ratio 212. Similarly, the power provided to the third, fourth and fifth resistive heaters 53, 54 and 55 by the third, fourth and fifth power outputs 243, 244 and 245 equals the electrical power provided on the first power line 61 multiplied by (or divided by) the third, fourth or fifth heater power ratios 213, 214 and 215, respectively. As a result, individual control of the heating power provided to the zones 42, 43, 44, 45 with respect to the power provided to the central region 41 is possible by respectively adjusting the power ratios 212, 213, 214, 215, and hence variations in the heating characteristics of the zones 42, 43, 44 and 45 may be individually compensated for with respect to each other and the central region 41. Of course, other designs for the power supply 240 are possible; whatever design may be chosen, the power supply 240 should individually control the heating power of each outer region zone 42-45 based upon the power supplied to the central region 41 and the respective power ratio 212-215 of that outer region zone 42-45.

By dividing the outer region 49 of the stage 20 into a multiplicity of zones 42-45 that surround the central region 41, and by further providing each of these outer region zones 42-45 a respective heater power ratio 212-215 with respect to the heating power provided to the central region 41, the instant heating system makes it possible to provide compensation for variations in the heating characteristics of different heating apparatuses 10, and to further provide compensation for variations in the heating characteristics of the CVD chamber 100 itself. By providing appropriate values for the heater power ratios 212-215, a consistent heating pattern may be provided across the susceptor 24, which should enhance process repeatability.

A calibration procedure may be performed for an individual heating apparatus 10 within a particular CVD chamber 100 to determine the appropriate heater power ratios 212-215 at any desired target temperature 211. With reference to FIGS. 1-6, one possible method for doing this is to initially set all heater power ratios 212-215 to default values, such as 1.0, or values obtained from an earlier calibration step. Then, a test wafer 301 may be placed onto susceptor 24 of heating apparatus 10, and the central region 41 may be heated to the desired target temperature 211. Subsequently, individual temperature measurements may be made in each of the outer region zones 42-45 on the wafer 301, for example by the use of thermocouples attached to each zone 42-45, or with one or more pyrometers. By way of the user I/O circuit 210, the heater power ratios 212-215 may then be adjusted, while the feedback control circuit 230 keeps the central region 41 at the target temperature 211, until the entire wafer 301 achieves a heating pattern that is as optimal as possible for the desired process. The resulting heater power ratios 212-215 may subsequently be used in production runs at that target temperature 211.

Of course, the heater power ratios 212-215 need not be constant values. On the contrary, the heater power ratios 212-215 may vary as functions of the target temperature 211, and consequently, an entire calibration procedure may involve a series of individual calibration steps at predetermined temperatures to obtain sets of heater power ratios 212-215 at each of these predetermined temperatures. Interpolation may then be used to determine heater power ratios 212-215 at target temperatures 211 that are between the predetermined temperatures.

It will be appreciated that the control system for controlling the heating apparatus 10 may comprise a plurality a temperature sensors. Each temperature sensor may measure the temperature of a single region or zone of the stage. The temperature sensors may include thermocouples, pyrometers or other suitable temperature sensing devices. Combinations of different types of temperature sensors may be used as well.

Although the invention herein has been described with reference to particular embodiments, it is to be understood that these embodiments are merely illustrative of the principles and applications of the present invention. It will be apparent to those skilled in the art that various modifications and variations can be made to the method, apparatus and system of the present invention without departing from the spirit and scope of the invention. For example, the outer region of the body of the stage may be divided not into only four zones, but into any number of zones greater than one. In certain embodiments, each of these zones would be provided its respective heating power ratio. Also, the resistive heater zones may overlap with each other. The various heating elements may be on the top surface, bottom surface or embedded in the body of the stage. Zonal temperature measurement may be provided by utilizing multiple temperature measurement devices (thermocouple, pyrometer, etc). Thus, it is intended that the present invention include modifications and variations that are within the scope of the appended claims and their equivalents.

What is claimed:

1. An apparatus comprising:
a stage comprising a body and a surface having an area to support a substrate, the body comprising a central region and an outer region;
a shaft coupled to the stage;
a first heating element consisting essentially of a planar, continuous section of material disposed within a recess within the central region of the body of the stage; and
at least second and third heating elements consisting essentially of planar, continuous sections of material disposed within recesses within the outer region of the body of the stage, the at least second and third heating elements each partially surrounding the first heating element and wherein the at least second and third heating elements are circumferentially adjacent to each other,
wherein the first heating element is disposed within a first plane of the body of the stage adjacent to one of a top surface or bottom surface of the body of the stage, and the second and third heating elements are disposed within a second plane of the body of the stage adjacent to the other of the top surface or bottom surface of the body of the stage and dielectric material is disposed across the top surface to provide a susceptor, the susceptor including lip edges to hold the substrate during processing.

2. The apparatus of claim 1 further comprising only one temperature measuring device for controlling the respective temperatures of the heating elements, the temperature measuring device thermally coupled to the central region of the body.

3. The apparatus of claim 1, further comprising at least fourth and fifth heating elements comprising planar, continuous sections of material disposed within recesses within the outer region of the body of the stage, the second, third, fourth and fifth heating elements substantially defining circumferentially adjacent quadrants that respectively partially surround the first heating element.

4. The apparatus of claim 3, wherein the first heating element is disposed within the first plane of the body of the stage adjacent to one of a top or a bottom surface of the body of the stage, and the second, third, fourth and fifth heating elements are disposed within the second plane of the body of the stage adjacent to the other of the top or bottom surface of the body of the stage.

5. The apparatus of claim 1, wherein the stage is comprised of a material that can withstand temperatures in excess of at least about 750° C.

6. The apparatus of claim 5, wherein the stage comprises aluminum nitride.

7. The apparatus of claim 1, wherein at least one of the heating elements comprises pyrolytic graphite.

8. The apparatus of claim 1, wherein at least one of the heating elements has a thermal expansion property similar to that of the body.

9. The apparatus of claim 1, wherein at least one of the heating elements has a thermal expansion property similar to that of the body.

10. A reactor incorporating the apparatus of claim 1, wherein the reactor includes a chamber for formation of films on the substrate and the apparatus is located in the chamber.

11. A reactor incorporating the apparatus of claim 4, wherein the reactor includes a chamber for formation of films on the substrate and the apparatus is located in the chamber.

12. A heating system for chemical vapor deposition comprising the apparatus of claim 1; a temperature sensor for measuring a temperature of the central region of the stage; at least first, second and third power sources for respectively providing power to the first, second and third heating elements; and a control system for controlling the first, second and third power sources.

13. A heating system for chemical vapor deposition comprising the apparatus of claim 4; a temperature sensor for measuring a temperature of the central region of the stage; at least first, second, third, fourth and fifth power sources for respectively providing power to the first, second, third, fourth and fifth heating elements; and a control system for controlling the first, second, third, fourth and fifth power sources.

14. The heating system of claim 12, wherein the temperature sensor is the only temperature sensor used to measure a temperature of the heating element and the control system controls the temperature according to an output from the temperature sensor and an algorithm of a power ratio of power to the second and first heating elements and a power ratio of power to the third and the first heating elements.

15. The heating system of claim 13, wherein the temperature sensor is the only temperature sensor used to measure the temperature of the heating element and the control system controls the temperature according to an output from the temperature sensor and an algorithm of a power ratio of power to the second and first heating elements, a power ratio of power to the third and the first heating elements, a power ratio of power to the fourth and the first heating elements, and a power ratio of power to the fifth and the first heating elements.

16. A method for resistive heating of substrates comprising:
providing the apparatus of claim 1;
providing each outer region of the body of the stage a respective power ratio with respect to the central region;
measuring a temperature of the central region;
providing heating power to the central region according to the measured temperature; and
providing heating power delivered to each outer region according to the heating power delivered to the central region and the respective power ratio of the outer region.

17. The method of claim 16, further comprising performing a calibration procedure to obtain the power ratios.

18. A method for resistive heating of substrates comprising:
providing the apparatus of claim 4;

providing each outer region of the body of the stage a respective power ratio with respect to the central region;

measuring a temperature of the central region;

providing heating power to the central region according to the measured temperature; and providing heating power delivered to each outer region according to the heating power delivered to the central region and the respective power ratio of the outer region.

19. The method of claim 18, further comprising performing a calibration procedure to obtain the power ratios.

20. A substrate heating apparatus comprising:

a stage comprising a body and a top surface having an area to support a substrate;

a shaft coupled to the stage;

a first heating element having thermal expansion properties that are similar to those of the body, wherein the first heating element is disposed within a recess adjacent to the top surface of the body of the stage, and located in a central region of the body of the stage;

two or more outer heating elements having thermal expansion properties that are similar to those of the body disposed within recesses adjacent to a bottom surface of the body of the stage, and located in an outer region of the body of the stage, so that the two or more outer heating elements are below and partially surrounding the first heating element, and wherein the two or more outer heating elements are circumferentially adjacent to each other;

a temperature sensor for measuring the temperature of the central region of the stage;

three or more power sources for respectively providing power to the first heating element and the two or more outer heating elements; and a control system for controlling at least a first, second and third power sources, wherein the control system controls the temperature according to an output from the temperature sensor and an algorithm of a power ratio between the first heating element and separately for each of the two or more outer heating elements.

* * * * *